United States Patent
Sharma (10) Patent No.: US 12,143,112 B2
(45) Date of Patent: Nov. 12, 2024

(54) CIRCUIT FOR CONTROLLING THE SLEW RATE OF A TRANSISTOR

(71) Applicant: GlobalFoundries U.S. Inc., Malta, NY (US)

(72) Inventor: Santosh Sharma, Austin, TX (US)

(73) Assignee: GlobalFoundries U.S. Inc., Malta, NY (US)

( * ) Notice: Subject to any disclaimer, the term of this patent is extended or adjusted under 35 U.S.C. 154(b) by 48 days.

(21) Appl. No.: 18/045,909

(22) Filed: Oct. 12, 2022

(65) Prior Publication Data

US 2024/0128958 A1    Apr. 18, 2024

(51) Int. Cl.
*H03K 5/04*    (2006.01)
*H03K 17/687*    (2006.01)

(52) U.S. Cl.
CPC .......... *H03K 5/04* (2013.01); *H03K 17/6871* (2013.01)

(58) Field of Classification Search
CPC .............................. H03K 5/04; H03K 17/6871
See application file for complete search history.

(56) References Cited

U.S. PATENT DOCUMENTS

| | | | |
|---|---|---|---|
| 6,075,414 A | 6/2000 | Nagaoka et al. | |
| 9,692,408 B2 | 6/2017 | Roberts et al. | |
| 9,929,652 B1 | 3/2018 | Ribarich et al. | |
| 10,749,514 B2 | 8/2020 | Lee et al. | |
| 2002/0153938 A1 | 10/2002 | Baudelot et al. | |
| 2003/0151865 A1 | 8/2003 | Maio | |
| 2011/0193619 A1 | 8/2011 | Parikh et al. | |
| 2013/0182357 A1* | 7/2013 | Brodsky | H01L 27/0281 361/56 |
| 2014/0062585 A1 | 3/2014 | Weis | |

(Continued)

FOREIGN PATENT DOCUMENTS

TW    202213700 A  *  4/2022  ......... H01L 27/0266
WO    2017176287 A1    10/2017

OTHER PUBLICATIONS

Wu et al., "Prediction of overshoot and crosstalk of low-voltage GaN HEMT using analytical model," IET Power Electronics, 2022, vol. 15, pp. 1295-1321.

(Continued)

*Primary Examiner* — Metasebia T Retebo
(74) *Attorney, Agent, or Firm* — David Cain; Hoffman Warnick LLC (57) ABSTRACT

Disclosed are circuits for controlling slew rate of a transistor during switching. Each circuit includes a first transistor (e.g., a gallium nitride (GaN)-based high electron mobility transistor (HEMT) or metal-insulator-semiconductor HEMT (MISHEMT)), a capacitor, and a second transistor. The first transistor includes a first gate connected to a pad for receiving a pulse-width modulation (PWM) signal, a first drain region connected to a first plate of the capacitor, and a first source region. The second transistor includes a second gate connected to a second plate of the capacitor, a second drain region, and a second source region and is connected to both the pad and the first transistor. The connection between the first and second transistors varies depending on whether the first transistor is an enhancement or depletion mode device and on whether the slew rate control is employed for on state or off state switching.

14 Claims, 3 Drawing Sheets

(56) References Cited

U.S. PATENT DOCUMENTS

2020/0227546 A1* 7/2020 Huang ............... H10N 70/883
2022/0270544 A1* 8/2022 Park ........................ G09G 3/32

OTHER PUBLICATIONS

Sun et al., "Active dv/dt control of 600V GaN transistors," published In 2016 IEEE Energy Conversion Congress and Exposition (ECCE), downloaded from IEEE Xplore on Jun. 16, 2022, 8 pages.
U.S. Appl. No. 18/455,669, filed Aug. 25, 2023, 27 pages.
European Search Report or corresponding EP Application No. 23196216.8-1211 dated Feb. 14, 2024, 14 pages.
European Search Report for corresponding EP Application No. 23196216.8-1211 dated Apr. 26, 2024, 13 pages.

* cited by examiner

CIRCUIT FOR CONTROLLING THE SLEW RATE OF A TRANSISTOR

BACKGROUND

The present disclosure relates to transistors, such as high electron mobility transistors (HEMTs) and metal-insulator-semiconductor HEMTs (MISHEMTs), and more particularly, to embodiments of a circuit for controlling the slew rate of such a transistor.

III-V semiconductor devices, such as gallium nitride (GaN)-based high electron mobility transistors (HEMTs) and metal-insulator-semiconductor HEMTs (MISHEMTs) or other III-V semiconductor transistors, have emerged as a leading technology for radio frequency (RF) and millimeter wave (mmWave) (e.g., 3-300 GHz) wireless applications. Such devices have extremely fast switching rates due to low capacitances and transconductances. Unfortunately, these fast switching rates can lead to ringing and higher order harmonics. In some devices, such as power supplies, the ringing and higher order harmonics can lead to electromagnetic interference that requires expensive filtering components to minimize.

SUMMARY

Disclosed herein are embodiments of control circuits for controlling the slew rate and, particularly, the derivation of the output voltage over time (dVout/dt) of a transistor, such as a III-V semiconductor transistor (e.g., a GaN-based HEMT or MISHEMT), during switching in order to minimize electromagnetic interference and thereby minimize the need for expensive filtering components.

One embodiment of such a control circuit can include a pad, a first transistor, a capacitor and a second transistor. In this embodiment, the first transistor can be an enhancement mode device and the second transistor can be a depletion mode device. The first transistor can have a first source region connected to ground, a first drain region, and a first gate. The capacitor can have a first plate connected to the first drain region and a second plate opposite the first plate. The second transistor can have a second source region connected to the first gate, a second drain region connected to the pad, and a second gate connected to the second plate.

Another embodiment of such a control circuit can include a pad, a first transistor, a capacitor and a second transistor. In this embodiment, both the first transistor and the second transistor can be enhancement mode devices. The first transistor can have a first source region connected to ground, a first drain region, and a first gate connected to the pad. The capacitor can have a first plate connected to the first drain region and a second plate opposite the first plate. The second transistor can have a second source region connected to ground, a second drain region connected to the first gate, and a second gate connected to the second plate.

Yet another embodiment of such a control circuit can include a pad, a first transistor, a capacitor, and a second transistor. In this embodiment, both the first transistor and the second transistor can be depletion mode devices. The first transistor can have a first source region, a first drain region, and a first gate connected to the pad. The capacitor can have a first plate connected to the first drain region and a second plate opposite the first plate. The second transistor can have a second source region connected to ground, a second drain region connected to the first gate, and a second gate connected to the second plate.

BRIEF DESCRIPTION OF THE SEVERAL VIEWS OF THE DRAWINGS

The present disclosure will be better understood from the following detailed description with reference to the drawings, which are not necessarily drawn to scale and in which.

DETAILED DESCRIPTION

As mentioned above, III-V semiconductor transistors, such as GaN-based HEMTs and MISHEMTs or other III-V semiconductor transistors, have fast switching rates due to low capacitances and transconductances. Unfortunately, these fast switching rates can lead to ringing and higher order harmonics. In some devices, such as power supplies, the ringing and higher order harmonics can lead to electromagnetic interference that requires expensive filtering components to minimize.

In view of the foregoing, disclosed herein are embodiments of control circuits for controlling the slew rate and, particularly, the derivation of the output voltage over time (dVout/dt) of a III-V semiconductor transistor, such as GaN-based HEMT or MISHEMT or other III-V semiconductor transistor, during switching in order to minimize electromagnetic interference and thereby minimize the need for expensive filtering components. Each of the disclosed circuits can include a first transistor (e.g., a III-V semiconductor transistor, such as a GaN-based HEMT or MISHEMT), a capacitor, and a second transistor. The first transistor can include a first gate connected to a pad for receiving a pulse-width modulation (PWM) signal, a first drain region connected to a first plate of the capacitor, and a first source region. The second transistor can include a second gate connected to a second plate of the capacitor, a second drain region, and a second source region and can be connected to both the pad and the first transistor. As discussed in greater detail below, the connection between the first and second transistors can vary depending on whether the first transistor is an enhancement or depletion mode device and on whether the slew rate control is employed for on state or off state switching.

Figure 1:
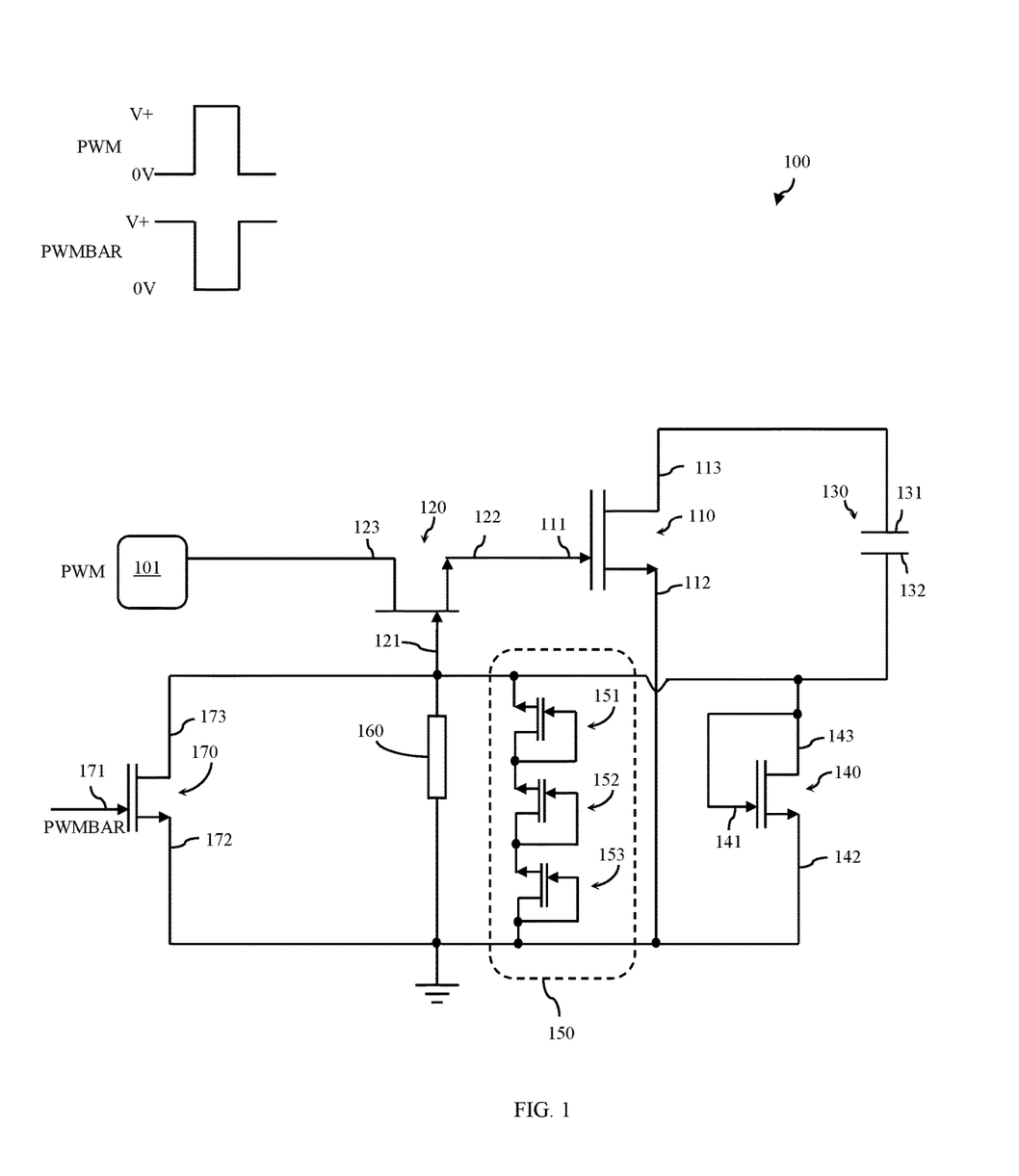
FIG. 1 is a circuit diagram illustrating an embodiment of a circuit for controlling the slew rate of an enhancement mode III-V semiconductor transistor, during switching to an on state.

More particularly, FIG. 1 is a circuit diagram illustrating an embodiment of a circuit 100 for controlling the slew rate (i.e., dVout/dt) of a high voltage, enhancement mode, III-V semiconductor transistor, such as a high voltage enhancement mode GaN-based HEMT or MISHEMT or other III-V semiconductor-based HEMT or MISHEMT, during switching of the transistor specifically to an on state from an off-state.

The circuit 100 can include an input/output pad 101 (also referred to herein as a pad or gate pad). The pad 101 can receive a gate control signal. The gate control signal can, for example, be a pulse-width modulation (PWM) signal, which oscillates between a low voltage (e.g., 0V or some other suitable low voltage) and a high voltage (e.g., 7V or some other suitable high voltage).

The circuit 100 can include a first transistor 110. The first transistor 110 can include a first source region 112 electrically connected to ground, a first drain region 113, a first channel region between the first source region 112 and the first drain region 113, and a first gate 111 adjacent to the first channel region. This first transistor 110 can be, for example, a high voltage, N-channel, enhancement mode III-V semiconductor transistor (e.g., a GaN-based HEMT or MISHEMT or some other III-V semiconductor-based HEMT or MISHEMT). Various high voltage, N-channel, enhancement mode GaN-based HEMT and MISHEMT configurations are well known in the art and, thus, the details thereof have been omitted from this specification in order to allow the reader to focus on the salient aspects of the disclosed embodiments. However, it should be understood that the description of the first transistor 110 and any other transistor discussed herein as being an enhancement mode device refers to the fact that the transistor is normally in an off state and that application of a positive gate voltage to the gate thereof is required to switch the transistor to the on state (i.e., the conductive state).

The circuit 100 can further include a second transistor 120. The second transistor 120 can include a second source region 122 electrically connected to the first gate 111 of the first transistor 110, a second drain region 123 electrically connected to the pad 101, a second channel region between the second source region 122 and the second drain region 123, and a second gate 121 adjacent to the second channel region. This second transistor 120 can be, for example, a low-voltage, N-channel, depletion mode device. In some embodiments, the second transistor 120 can be a III-V semiconductor transistor (e.g., a GaN-based HEMT or MISHEMT or other III-V semiconductor HEMT or MISHEMT). In other embodiments, the second transistor 120 could be a different type of transistor (e.g., a complementary metal oxide semiconductor (CMOS) transistor, a bipolar junction transistor (BJT), etc. if such devices are integrated on the same chip with III-V semiconductor devices). In any case, various low voltage, N-channel, depletion mode device configurations are well known in the art and, thus, the details thereof have been omitted from this specification in order to allow the reader to focus on the salient aspects of the disclosed embodiments. However, it should be understood that the description of the second transistor 120 and any other transistor discussed herein as being a depletion mode device refers to the fact that the transistor is normally in an on state (i.e., a conductive state) and that application of a ground or negative gate voltage is required to switch the transistor to the off state. As discussed in greater detail below with regard to circuit 100 operation, this second transistor 120 allows impedance to be inserted between the pad 101 and the first gate 111 of the first transistor 110 in order to slow a voltage rise on the first gate 111 when necessary.

The circuit 100 can further include a capacitor 130. The capacitor 130 can be, for example, a high voltage metal-oxide-metal (MOM) capacitor or some other suitable high voltage capacitor. The capacitor 130 can have a first conductive plate 131, a second conductive plate 132 opposite and essentially parallel to the first conductive plate 131, and a dielectric layer between the two plates 131-132. The first conductive plate 131 can be electrically connected to the first drain region 113 of the first transistor and the second conductive plate 132 can be electrically connected to the second gate 121 of the second transistor 120.

The circuit 100 can further include a third transistor 170, a resistor 160, a voltage clamp 150, and a fourth transistor 140 connected in parallel between the second gate 121 of the second transistor 120 and ground. More specifically, the third transistor 170 can have a third source region 172 electrically connected to ground, a third drain region 173 electrically connected to the second gate 121 of the second transistor 120, a third channel region between the third source region and the third drain region, and a third gate 171 adjacent to the third channel region. The third gate 171 can be controlled by an inverted pulse-width modulation signal (PWMBAR) (i.e., another gate control signal that is inverted with respect to PWM). The resistor 160 can be, for example, a resistor derived from two-dimensional electron gas layer in an aluminum gallium nitride (AlGaN)/GaN heterostructure. Alternatively, the resistor 160 could be any other suitable resistor, such as a tantalum nitride (TaN) resistor, a silicon chromium (SiCr) resistor, or a polysilicon resistor. The fourth transistor 140 can have a fourth source region 142 electrically connected to ground, a fourth drain region 143 electrically connected to the second gate 121 of the second transistor 120, a fourth channel region between the fourth source region and the fourth drain region, and a fourth gate 141 adjacent to the fourth channel region and also electrically connected to the fourth drain region 143. The third transistor 170 and the fourth transistor 140 can both be, for example, N-channel, enhancement mode devices (i.e., normally in an off state as discussed above). In some embodiments, the third transistor 170 and the fourth transistor 140 can be III-V semiconductor transistors (e.g., GaN-based HEMTs and/or MISHEMTs or other III-V semiconductor-based HEMTs and/or MISHEMTs). In other embodiments, they could be some different type of transistor (e.g., CMOS transistors, BJTs, etc. if such devices are integrated on the same chip with III-V semiconductor devices). The voltage clamp 150 can be a negative voltage clamp. For example, the negative voltage clamp can include two or more stacked N-channel enhancement mode transistors (e.g., see transistors 151-153) with the drain region of the bottom transistor 153 in the stack being connected to ground and the source region of the top transistor 151 in the stack being connected to the second gate 121 of the second transistor 120 and with the gates of each transistor in the stack being tied to their respective drain regions.

In the circuit 100, as described above, the second transistor 120 allows impedance to be inserted between the pad 101 and the first gate 111 of the first transistor 110 in order to allow the voltage rise on the first gate 111 to be slowed down during switching of the first transistor 110 to the on state when necessary. That is, instead of applying PWM directly to the first gate 111 so that the voltage rise on the first gate 111 corresponds to the rise time of PWM from low to high and is, thus, very quick when the first transistor 110 switches to the on state, impedance created by the second transistor 120 can be employed to slow down the voltage rise, for example, when dV/dt begins to happen. Specifically, an operation can start with the first transistor 110 in an off state, PWM low, and PWMBAR high. When PWM switches from low to high, the second transistor 120 will be in an on-state (i.e., conductive) and will pull up the gate voltage on the first gate 111 of the first transistor 110 and, thereby switch the first transistor 110 to the on-state. Initially, when the first transistor 110 switches to the on state, there will be a negative dVout/dt on the first drain region 113 of the first transistor 110. This will couple through capacitor 130 and resistor 160 (which, in combination, form a high pass filter) to the second gate 121 of the second transistor 120, thereby pulling the gate voltage on the second gate 121 of the second transistor 120 down below ground. This will, in turn, debias the second transistor 120 and, thus, increase the impedance in series between the pad 101 and the first gate 111 of the first transistor 110. The increase in impedance between the pad 101 and the first gate 111 of the first transistor 110 effectively slows down the dVout/dt in a negative feedback loop. The negative feedback loop stabilizes to establish a slower dVout/dt until the first drain region 113 of the first transistor 110 completely switches, after which the second transistor 120 will once again fully turn on. It should be noted that in the circuit 100, as described above, the negative voltage clamp 150 is configured to prevent the gate voltage on the first gate 111 from ever dropping too far below ground and the fourth transistor 140 is configured to prevent the second gate 121 of the second transistor 120 from jumping up during positive dVout/dt.

Figure 2:
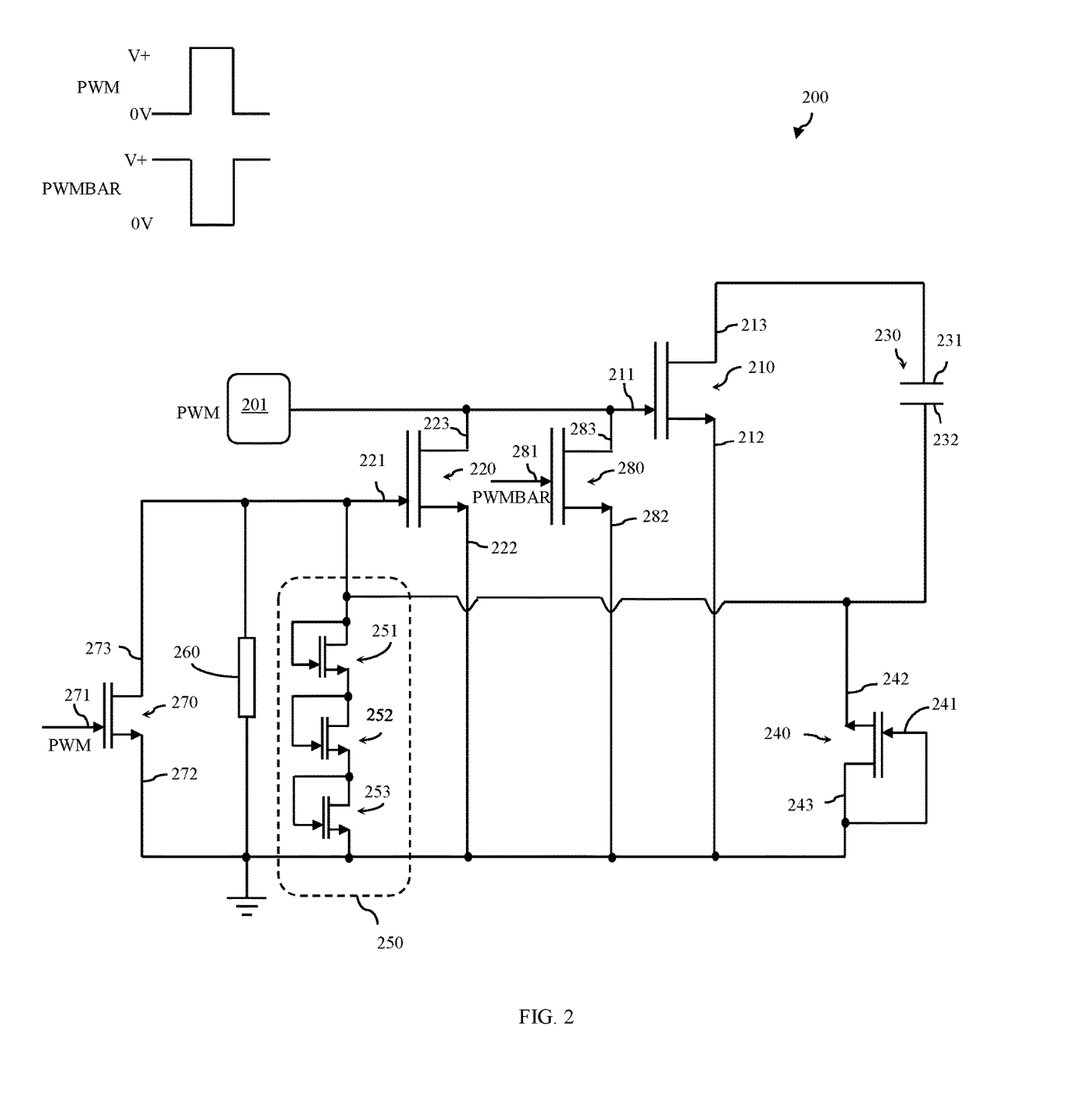
FIG. 2 is a circuit diagram illustrating an embodiment of a circuit for controlling the slew rate of an enhancement mode III-V semiconductor transistor, during switching of the transistor to an off state.

FIG. 2 is a circuit diagram illustrating an embodiment of a circuit 200 for controlling the slew rate (i.e., dVout/dt) of a high voltage enhancement mode III-V semiconductor transistor, such as a high voltage enhancement mode GaN-based HEMT or MISHEMT or other III-V semiconductor-based HEMT or MISHEMT, during switching of the transistor specifically to an off state from an on-state.

The circuit 200 can include an input/output pad 201 (also referred to herein as a pad or gate pad). The pad 201 can receive a gate control signal. The gate control signal can, for example, be a pulse-width modulation (PWM) signal, which oscillates between a low voltage (e.g., 0V or some other suitable low voltage) and a high voltage (e.g., 7V or some other suitable high voltage).

The circuit 200 can include a first transistor 210. The first transistor 210 can include a first source region 212 electrically connected to ground, a first drain region 213, a first channel region between the first source region 212 and the first drain region 213, and a first gate 211 adjacent to the first channel region. This first transistor 210 can be, for example, a high voltage, N-type, enhancement mode III-V semiconductor transistor (e.g., a GaN-based HEMT or MISHEMT or some other III-V semiconductor-based HEMT or MISHEMT). As mentioned above with regard to the circuit 100 of FIG. 1, various high voltage, N-channel, enhancement mode GaN-based HEMT and MISHEMT configurations are well known in the art and, thus, the details thereof have been omitted from this specification in order to allow the reader to focus on the salient aspects of the disclosed embodiments.

The circuit 200 can further include a second transistor 220. The second transistor 220 can include a second source region 222 electrically connected to ground, a second drain region 223 electrically connected to a node between the pad 201 and the first gate 211 of the first transistor 210, a second channel region between the second source region 222 and the second drain region 223, and a second gate 221 adjacent to the second channel region. This second transistor 220 can be, for example, a low-voltage, N-channel, enhancement mode device. In some embodiments, the second transistor 220 can be a III-V semiconductor transistor (e.g., GaN-based HEMT or MISHEMT or other III-V semiconductor-based HEMT or MISHEMT). In other embodiments, the second transistor 220 could be a different type of transistor (e.g., a complementary metal oxide semiconductor (CMOS) transistor, a bipolar junction transistor (BJT), etc. if such devices are integrated on the same chip with III-V semiconductor devices). In any case, various low voltage, N-channel, enhancement mode device configurations are well known in the art and, thus, the details thereof have been omitted from this specification in order to allow the reader to focus on the salient aspects of the disclosed embodiments.

The circuit 200 can further include a capacitor 230. The capacitor 230 can be, for example, a high voltage metal-oxide-metal (MOM) capacitor or some other suitable high voltage capacitor. The capacitor 230 can have a first conductive plate 231, a second conductive plate 232, and a dielectric layer between the two plates 231-232. The first conductive plate 231 can be electrically connected to the first drain region 213 of the first transistor 210 and the second conductive plate 232 can be electrically connected to the second gate 221 of the second transistor 220.

The circuit 200 can further include a third transistor 270, a resistor 260, a voltage clamp 250, and a fourth transistor 240 connected in parallel between the second gate 221 of the second transistor 220 and ground. The circuit 200 can further include a fifth transistor 280 connected in parallel with the second transistor between the first gate 211 of the first transistor 210 and ground. More specifically, the third transistor 270 can have a third source region 272 electrically connected to ground, a third drain region 273 electrically connected to the second gate 221 of the second transistor 220, a third channel region between the third source region and the third drain region, and a third gate 271 adjacent to the third channel region. The third gate 271 can be controlled by PWM (i.e., the same signal received at pad 201). The resistor 260 can be, for example, a resistor derived from two-dimensional electron gas layer in an AlGaN/GaN heterostructure. Alternatively, the resistor 160 could be any other suitable resistor, such as a tantalum nitride (TaN) resistor, a silicon chromium (SiCr) resistor, or a polysilicon resistor. The fourth transistor 240 can have a fourth source region 242 electrically connected to the second gate 221, a fourth drain region 243 electrically connected to ground, a fourth channel region between the fourth source region and the fourth drain region, and a fourth gate 241 adjacent to the fourth channel region and also electrically connected to the fourth drain region 243. The fifth transistor 280 can include a fifth source region 282 connected to ground, a fifth drain region 283 connected to the first gate 211, a fifth channel region between the fifth source region and the fifth drain region, and a fifth gate 281 adjacent to the fifth channel region controlled by PWMBAR. The third transistor 270, the fourth transistor 240, and the fifth transistor 280 can be, for example, N-channel, enhancement mode devices (i.e., normally in an off state as discussed above). In some embodiments, they can be III-V semiconductor transistors (e.g., GaN-based HEMTs and/or MISHEMTs or other III-V semiconductor-based HEMTs and/or MISHEMTs). In other embodiments, they could be some different type of transistor (e.g., CMOS transistors, BJTs, etc. if such devices are integrated on the same chip with III-V semiconductor devices). The voltage clamp 250 can be a positive voltage clamp. For example, the positive voltage clamp can include two or more stacked N-channel enhancement mode transistors (e.g., see transistors 251-253) with the source region of the bottom transistor 253 in the stack being connected to ground and the drain region of the top transistor 251 in the stack being connected to the second gate 221 of the second transistor 220 and with the gates of each transistor in the stack being tied to their respective drain regions.

In the circuit 200, as described above, the second transistor 220 allows a node between the pad 201 and the first gate 211 of the first transistor 210 to be pulled down in order to slow down positive dVout/dt on the first drain region 213 of the first transistor 210 during switching of the first transistor 210 to the off state when necessary. Specifically, an operation can start with the first transistor 210 in an on state, with PWM high and PWMBAR low. When PWM-BAR switches from low to high, the fifth transistor 280 (also referred to herein as the primary pull-down transistor) will switch to an on state and, thereby pulling down the gate voltage on the first gate 211 of the first transistor 210. As the gate voltage on the first gate 211 nears the threshold voltage (Vt) of the first transistor 210, the first transistor 210 will start to switch to the off state, thereby creating a positive dVout/dt on the first drain region 213. This positive dVout/dt will couple through the capacitor 230 and resistor 260 (which, in combination, form a high pass filter network) to the second gate 221 of the second transistor 220. The high pass filter network will raise the gate voltage on the second gate 221 to turn on the second transistor 220 (also referred to herein as the secondary or auxiliary pull-down transistor). When the second transistor 220 turns on, there will be additional pulldown on the first gate 211 of the first transistor 210 that will further slow down the positive dVout/dt on the first drain region 213 in a negative feedback loop.

Figure 3:
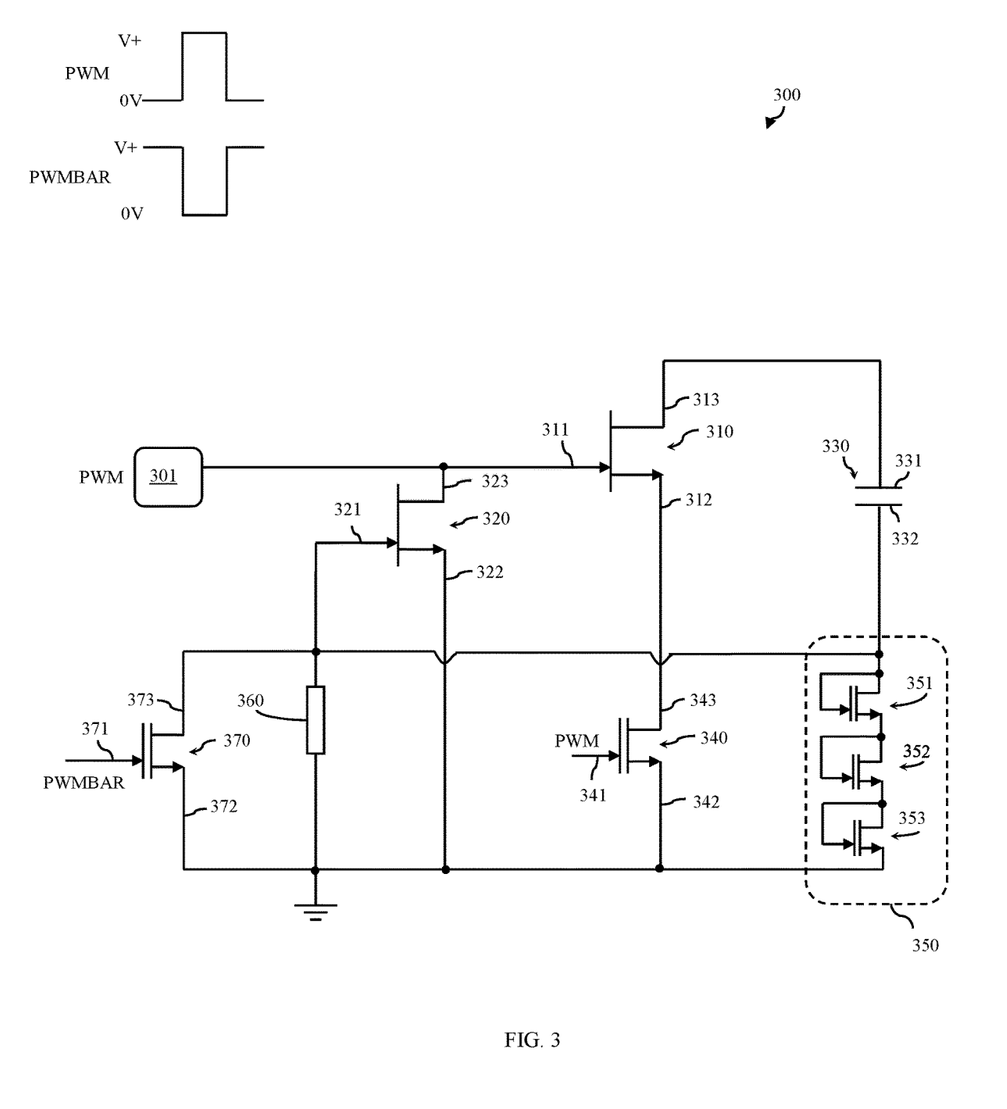
FIG. 3 is a circuit diagram illustrating an embodiment of a circuit for controlling the slew rate of a depletion mode III-V semiconductor transistor, during switching of the transistor to an on state.

FIG. 3 is a circuit diagram illustrating an embodiment of a circuit 300 for controlling the slew rate (i.e., dVout/dt) of a high voltage depletion mode III-V semiconductor transistor, such as a high voltage depletion mode GaN-based HEMT or MISHEMT or other III-V semiconductor-based HEMT or MISHEMT, during switching of the transistor specifically to an on state from an off state.

The circuit 300 can include an input/output pad 301 (also referred to herein as a pad or gate pad). The pad 301 can receive a gate control signal. The gate control signal can, for example, be a pulse-width modulation (PWM) signal, which oscillates between a low voltage (e.g., 0V or some other suitable low voltage) and a high voltage (e.g., 7V or some other suitable high voltage).

The circuit 300 can include a first transistor 310. The first transistor 310 can include a first source region 312 electrically connected to ground, a first drain region 313, a first channel region between the first source region 312 and the first drain region 313, and a first gate 311 adjacent to the first channel region. This first transistor 310 can be, for example, a high voltage, N-channel, depletion mode III-V semiconductor transistor (e.g., a GaN-based HEMT or MISHEMT or some other III-V semiconductor-based HEMT or MISHEMT). Various high voltage, N-channel, depletion mode GaN-based HEMT and MISHEMT configurations are well known in the art and, thus, the details thereof have been omitted from this specification in order to allow the reader to focus on the salient aspects of the disclosed embodiments.

The circuit 300 can further include a second transistor 320. The second transistor 320 can include a second source region 322 electrically connected to ground, a second drain region 323 electrically connected to a node between the pad 301 and the first gate 311 of the first transistor 310, a second channel region between the second source region 322 and the second drain region 323, and a second gate 321 adjacent to the second channel region. This second transistor 320 can be, for example, a low-voltage, N-channel, depletion mode device. In some embodiments, the second transistor 320 can be a III-V semiconductor transistor (e.g., a GaN-based HEMT or MISHEMT or other III-V semiconductor-based HEMT or MISHEMT). In other embodiments, the second transistor 320 could be a different type of transistor (e.g., a complementary metal oxide semiconductor (CMOS) transistor, a bipolar junction transistor (BJT), etc. if such devices are integrated on the same chip with III-V semiconductor devices). In any case, various low voltage, N-channel, depletion mode device configurations are well known in the art and, thus, the details thereof have been omitted from this specification in order to allow the reader to focus on the salient aspects of the disclosed embodiments.

The circuit 300 can further include a capacitor 330. The capacitor 330 can be, for example, a high voltage metal-oxide-metal (MOM) capacitor or some other suitable high voltage capacitor. The capacitor 330 can have a first conductive plate 331, a second conductive plate 332, and a dielectric layer between the two plates 331-332. The first conductive plate 331 can be electrically connected to the first drain region 313 of the first transistor 310 and the second conductive plate 332 can be electrically connected to the second gate 321 of the second transistor 320.

The circuit 300 can further include a third transistor 370, a resistor 360, and a voltage clamp 350 connected in parallel between the second gate 321 of the second transistor 320 and ground. The circuit 300 can further include a fourth transistor 340 connected in series between the first transistor 310 and ground. More specifically, the third transistor 370 can have a third source region 372 electrically connected to ground, a third drain region 373 electrically connected to the second gate 321 of the second transistor 320, a third channel region between the third source region and the third drain region, and a third gate 371 adjacent to the third channel region. The third gate 371 can be controlled by PWMBAR (i.e., an inverted gate control signal with respect to the gate control signal received at pad 301). The resistor 360 can be, for example, a resistor derived from two-dimensional electron gas layer in an AlGaN/GaN heterostructure. Alternatively, the resistor 160 could be any other suitable resistor, such as a tantalum nitride (TaN) resistor, a silicon chromium (SiCr) resistor, or a polysilicon resistor. The fourth transistor 340 can have a fourth source region 342 electrically connected to ground, a fourth drain region 343 electrically connected to the first source region 312 of the first transistor 310, a fourth channel region between the fourth drain region and the fourth source region, and a fourth gate 341 controlled by PWM. The third transistor 370 and the fourth transistor 340 can be, for example, N-channel, enhancement mode devices (i.e., normally in an off state as discussed above). In some embodiments, they can be GaN-based HEMTs and/or MISHEMTs or other III-V semiconductor-based HEMTs and/or MISHEMTs. In other embodiments, they could be some different type of transistor (e.g., CMOS transistors, BJTs, etc. if such devices are integrated on the same chip with GaN-based devices). The voltage clamp 350 can be a positive voltage clamp. For example, the positive voltage clamp can include two or more stacked N-channel enhancement mode transistors (e.g., see transistors 351-353) with the source region of the bottom transistor 353 in the stack being connected to ground and the drain region of the top transistor 351 in the stack being connected to both the second gate 321 of the second transistor 320 and the second conductive plate 332 of the capacitor 330 and with the gates of each transistor in the stack being tied to their respective drain regions. In the circuit 300, as described above, the second transistor 320 allows a node between the pad 301 and the first gate 311 of the first transistor 310 to be pulled down in order to slow down negative dVout/dt on the first drain region 313 of the first transistor 310 during switching of the first transistor 310 to the on state when necessary. Specifically, an operation can start with the first transistor 310 in an off state, with PWM low and PWMBAR high. With PWM-BAR high, the third transistor 370 will be on and will pull down the gate voltage on the second gate 321 of the second transistor 320. Since the gate voltage on the second gate 321 of the second transistor 320 is held low, it will be fully turned on because, as mentioned above, the second transistor 320 is specifically a depletion mode device in this embodiment. The second source region 322 of the second transistor 320 will also be low, as it is connected to ground. As a result, the second transistor provides a low impedance path from the first gate 311 of the first transistor 310 to ground. Additionally, when PWM is low and PWMBAR is high (and the first transistor 310 is in the off state state), the first source region 312 of the first transistor 310 will be at the pinch off voltage (Vpinch) of the first transistor 310 because, as mentioned above, the first transistor 310 is also a depletion mode device in this embodiment. Subsequently, when PWM goes high and PWMBAR goes low, the fourth transistor 340 will turn on, thereby pulling down the source voltage on the first source region 312 of the first transistor 310 to ground. The first gate 311 is already at ground and, thus, the first transistor 310 (which as mentioned above is a depletion mode device) will turn on causing a negative dVout/dt. This negative dVout/dt will couple through the capacitor 330 and resistor 360 (which, in combination, form a high pass filter network) and will pull down the gate voltage on the second gate 321 of the second transistor 320 (i.e., the other depletion mode device) below the source voltage thereof so as to increase its impedance. As a result, the Miller capacitance (Cgd) of the first transistor 310 (i.e., the intrinsic capacitance between the first drain region 313 and the first gate 311 of the first transistor 310) will push the gate voltage on the first gate 311 below ground, thereby slowing down the negative dVout/dt. With this configuration, a negative feedback loop will be established to setup a dVout/dt and this effect will stop once the dVout/dt is completed.

It should be understood that in the circuit structure embodiments described above a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V semiconductor materials (also referred to as III-V compound semiconductors), which are compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a pad;
a first transistor having a first source region connected to ground, a first drain region, and a first gate, wherein the first transistor is an enhancement mode device;
a capacitor having a first plate connected to the first drain region and a second plate opposite the first plate;
a second transistor having a second source region connected to the first gate, a second drain region connected to the pad, and a second gate connected to the second plate, wherein the second transistor is a depletion mode device; and
a third transistor, a resistor, a voltage clamp, and a fourth transistor connected in parallel between the second gate and ground,
wherein the pad receives a pulse-width modulation signal.

2. The structure of claim 1, wherein the first transistor and the second transistor are III-V semiconductor transistors.

3. The structure of claim 1, wherein the first transistor is one of a gallium nitride-based high electron mobility transistor and a gallium nitride-based metal-insulator-semiconductor high electron mobility transistor.

4. The structure of claim 1,
wherein the third transistor has a third gate controlled by an inverted pulse-width modulation signal, a third source region connected to ground, and a third drain region connected to the second gate,
wherein the fourth transistor has a fourth gate, a fourth source region connected to ground, and a fourth drain region connected to the second gate and to the fourth gate, and
wherein the third transistor and the fourth transistor are enhancement mode devices.

5. The structure of claim 1,
wherein the first transistor, the second transistor, the third transistor and the fourth transistor are N-channel transistors, and
wherein the voltage clamp is a negative voltage clamp.

6. A structure comprising:
a pad;
a first transistor having a first source region connected to ground, a first drain region, and a first gate connected to the pad;
a capacitor having a first plate connected to the first drain region and a second plate opposite the first plate;
a second transistor having a second source region connected to ground, a second drain region connected to the first gate, and a second gate connected to the second plate, wherein the first transistor and the second transistor are enhancement mode devices;
a third transistor, a resistor, a voltage clamp, and a fourth transistor connected in parallel between the second gate and ground; and
a fifth transistor connected in parallel with the second transistor between the first gate and ground,
wherein the pad receives a pulse-width modulation signal.

7. The structure of claim 6, wherein the first transistor and the second transistor are III-V semiconductor transistors.

8. The structure of claim 6, wherein the first transistor is one of a gallium nitride-based high electron mobility transistor and a gallium nitride-based metal-insulator-semiconductor high electron mobility transistor.

9. The structure of claim 6,
wherein the third transistor has a third gate controlled by the pulse-width modulation signal, a third source region connected to ground, and a third drain region connected to the second gate,
wherein the fourth transistor has a fourth gate, a fourth source region connected to the second gate, and a fourth drain region connected to ground and the fourth gate,
wherein the fifth transistor has a fifth gate controlled by an inverted pulse-width modulation signal, a fifth source region connected to ground, and a fifth drain region connected to the first gate, and
wherein the third transistor, the fourth transistor and the fifth transistor are enhancement mode devices.

10. The structure of claim 6,
wherein the first transistor, the second transistor, the third transistor, the fourth transistor and the fifth transistor are N-channel transistors, and
wherein the voltage clamp is a positive voltage clamp.

11. A structure comprising:
a pad;
a first transistor having a first source region, a first drain region, and a first gate connected to the pad;
a capacitor having a first plate connected to the first drain region and a second plate opposite the first plate;
a second transistor having a second source region connected to ground, a second drain region connected to the first gate, and a second gate connected to the second plate, wherein the first transistor and the second transistor are depletion mode devices;
a third transistor, a resistor, and a voltage clamp connected in parallel between the second gate and ground; and
a fourth transistor connected in series between the first transistor and ground,
wherein the pad receives a pulse-width modulation signal.

12. The structure of claim 11, wherein the first transistor and the second transistor are III-V semiconductor transistors.

13. The structure of claim 11, wherein the first transistor is one of a gallium nitride-based high electron mobility transistor and a gallium nitride-based metal-insulator-semiconductor high electron mobility transistor.

14. The structure of claim 1,
wherein the third transistor has a third gate controlled by an inverted pulse-width modulation signal, a third source region connected to ground, and a third drain region connected to the second gate,
wherein the fourth transistor has a fourth gate controlled by the pulse-width modulation signal, a fourth source region connected to ground, and a fourth drain region connected to the first source region,
wherein the third transistor and the fourth transistor are enhancement mode devices,
wherein the first transistor, the second transistor, the third transistor and the fourth transistor are N-channel transistors, and
wherein the voltage clamp is a positive voltage clamp.

* * * * *

UNITED STATES PATENT AND TRADEMARK OFFICE
CERTIFICATE OF CORRECTION

| | | |
|---|---|---|
| PATENT NO. | : 12,143,112 B2 | Page 1 of 1 |
| APPLICATION NO. | : 18/045909 | |
| DATED | : November 12, 2024 | |
| INVENTOR(S) | : Santosh Sharma | |

It is certified that error appears in the above-identified patent and that said Letters Patent is hereby corrected as shown below:

In the Claims

Column 12, Line 46, that reads: "The structure of claim 1," should read "The structure of claim 11."

Signed and Sealed this
Thirty-first Day of December, 2024

Derrick Brent
*Acting Director of the United States Patent and Trademark Office*